(12) United States Patent
Lee

(10) Patent No.: US 8,705,159 B2
(45) Date of Patent: Apr. 22, 2014

(54) MICROELECTROMECHANICAL SYSTEM WITH A CENTER OF MASS BALANCED BY A MIRROR SUBSTRATE

(75) Inventor: Chris Seung Bok Lee, Ithaca, NY (US)

(73) Assignee: Calient Technologies, Inc., Goleta, CA (US)

(*) Notice: Subject to any disclaimer, the term of this patent is extended or adjusted under 35 U.S.C. 154(b) by 361 days.

(21) Appl. No.: 13/106,709

(22) Filed: May 12, 2011

(65) Prior Publication Data

US 2012/0287492 A1   Nov. 15, 2012

(51) Int. Cl.
*G02B 26/06* (2006.01)

(52) U.S. Cl.
USPC ........................................ 359/221.2

(58) Field of Classification Search
USPC ............... 359/223.1–226.1, 290, 291, 872
See application file for complete search history.

(56) References Cited

U.S. PATENT DOCUMENTS

| | | | |
|---|---|---|---|
| 5,428,259 A | 6/1995 | Suzuki | |
| 6,753,638 B2 * | 6/2004 | Adams et al. | 359/224.1 |
| 7,728,339 B1 | 6/2010 | Adams et al. | |
| 2002/0158039 A1 | 10/2002 | Harris et al. | |
| 2003/0060051 A1 | 3/2003 | Kretschmann et al. | |
| 2008/0253007 A1 | 10/2008 | Ohara | |
| 2009/0059344 A1 | 3/2009 | Marxer et al. | |

OTHER PUBLICATIONS

PCT Invitation to Pay Additional Fees and, Where Applicable, Protest Fee for PCT Counterpart Application No. PCT/US2012/037593, 5 pgs. (Aug. 10, 2012).
PCT Notification of Transmittal of the International Search Report and the Written Opinion of the International Searching Authority, or the Declaration for PCT Counterpart Application No. PCT/US2012/037595 Containing International Search Report, 17 pgs. (Nov. 2, 2012).

* cited by examiner

*Primary Examiner* — Euncha Cherry
(74) *Attorney, Agent, or Firm* — SoCal IP Law Group LLP; Steven C. Sereboff; John E. Gunther

(57) ABSTRACT

MEMS and fabrication techniques for positioning the center of mass of released structures in MEMS are provided. In an embodiment, a mirror substrate is affixed to a member partially released from a first substrate and a through hole formed in the second substrate is accessed to complete release of the member.

23 Claims, 13 Drawing Sheets

MICROELECTROMECHANICAL SYSTEM WITH A CENTER OF MASS BALANCED BY A MIRROR SUBSTRATE

CROSS REFERENCE TO RELATED APPLICATIONS

This application is related to U.S. Non-Provisional application Ser. No. 13/106,693 filed on May 12, 2011, entitled "MICROELECTROMECHANICAL SYSTEM WITH BALANCED CENTER OF MASS," the entire contents of which are hereby incorporated by reference in its entirety for all purposes.

TECHNICAL FIELD

Embodiments of the invention relate to the field of microelectromechanical systems (MEMS) and, in particular, to MEM electrostatic actuators.

BACKGROUND

Many MEMS include a released structure which has a high aspect ratio (AR) member in which a longitudinal length of the member is at least five times larger than a transverse length of the member or a member spaced apart from another structure by a gap defining a space with a high AR. High AR members and/or associated gaps are useful for providing large capacitances. In the case of an accelerometer, a high capacitance structure translates into greater device sensitivity. In the case of an electrostatic motor, a high capacitance enables a high electrostatic force between the released structure and a surrounding drive electrode. A high force allows for released structure to be actuated over a large distance or angle at a lower applied voltage, for improved electrostatic motor performance. Even for MEMS implementations which do not need a large actuation angle, a high electrostatic force allows flexures to be mechanically stiffer to increase the resonant frequency of the released structure and overall reliability of the device in an operating environment.

Another consideration in many MEMS is fill factor, which for a micromirror array implementation is a ratio of the active refracting area to the total contiguous area occupied by the lens array. To maximize the fill factor, it is beneficial to suspend the high aspect ratio member with the longest dimension oriented perpendicularly to a surface of the mirror, as is described for actuator members in commonly assigned U.S. Pat. No. 6,753,638.

Whatever the MEMS application and however a member may be oriented, it is challenging to ensure the center of mass of the released structure is best positioned with respect to the structure's center of rotation (i.e., fulcrum). For example, where a released structure has uniform density, and the center of mass is the same as the centroid of the structure's shape, a high aspect ratio member will often cause the centroid to be offset from a plane containing the released structure's center of rotation.

FIG. 1 is a perspective view illustrating a schematic of a released structure 100. The member 111 has a high AR, such as a beam or a blade, with a longitudinal length 150 that is significantly longer than at least one of the transverse lengths 140 and 130. The high AR member 111 is coupled to a substrate (not depicted) via a flexure which is the center of rotation for the released structure 100 within the X-Y plane (192, 191) only while other flexures may further allow motion within the Z-direction (into/out of the page) 193. Because the high AR member 111 has a finite mass, the center of mass (CM) is located within the high AR member 111, a distance 138 below the center of rotation 135 (e.g., 50-100.mu.m). With a center of mass offset from the center of rotation, the released structure generally forms a pendulum subject to motion in response to external forces (e.g., vibration). Such motion is undesirable as it corresponds to noise during operation of the MEMS.

BRIEF DESCRIPTION OF THE DRAWINGS

Embodiments of the present invention are illustrated by way of example, and not limitation, in the figures of the accompanying drawings in which.

SUMMARY OF THE DESCRIPTION

Figure 1:
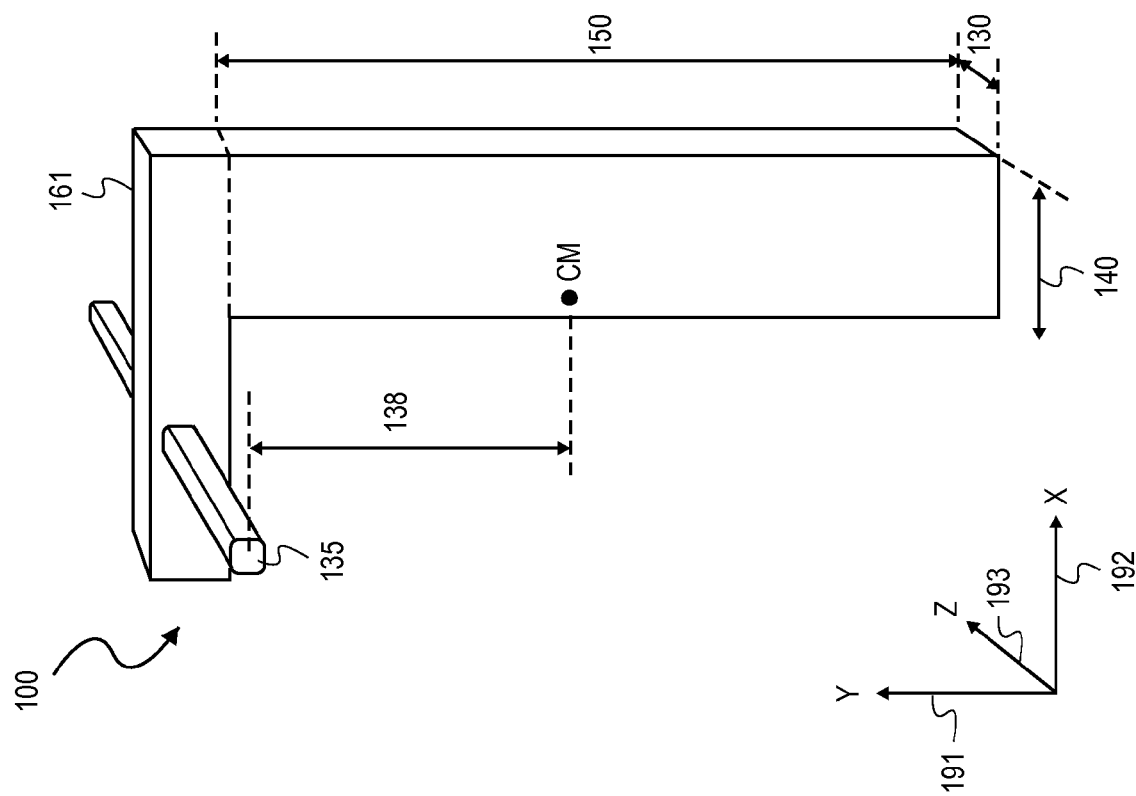
FIG. 1 illustrates a perspective view of a MEMS released structure with a conventional high AR member.

MEMS and fabrication techniques for positioning the center of mass of released structures in MEMS are provided. In an embodiment, a released structure includes a member with a recess formed into an end face of its free end.

In an embodiment, the recess is fabricated concurrently with an etching of sidewalls defining a longitudinal length of the member. In an embodiment, a released structure includes a plurality of members, with the longitudinal lengths of the members being of differing lengths. In an embodiment, members with differing longitudinal lengths are fabricated via multiple patterning of a masking layer. In another embodiment, members with differing longitudinal lengths are fabricated via embedding a patterned masking layer within a material stack from which the member is formed.

In an embodiment, mass of a released member disposed below a plane of a flexure is balanced by mass of a second substrate affixed to the released member. In an embodiment, a second substrate is affixed to a member partially released from a first substrate and a through hole formed in the second substrate is accessed to complete release of the member. In an embodiment, a second substrate is affixed to a plurality of partially released members and a single etch process is utilized to thin the second substrate, form the through hole, complete release of the member and singulate the second substrate into a plurality of mechanically independent structures. As described herein, one or more of the structures and techniques provided are utilized to balance masses of a released structure and thereby improve performance (e.g., reduce noise) in a MEMS.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific fabrication techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Figure 2A:
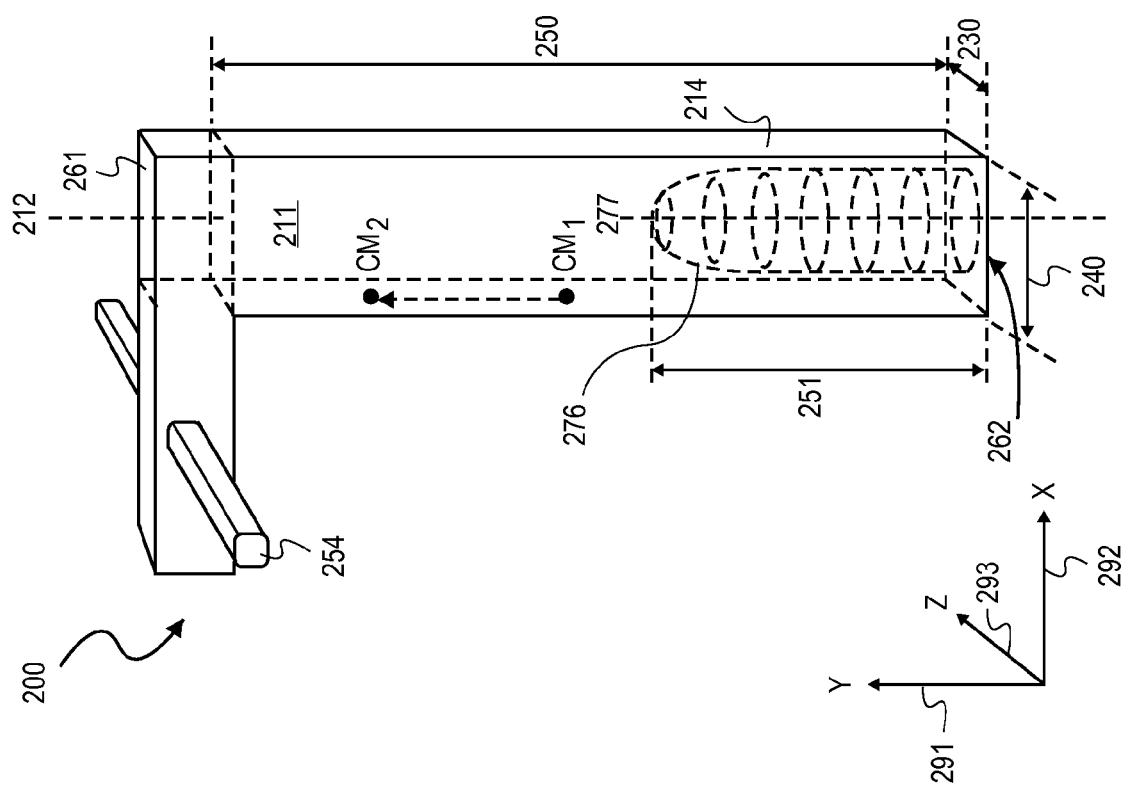
FIG. 2A illustrates a perspective view of a MEMS released structure with a member in accordance with an embodiment of the present invention.

FIG. 2A is a perspective view illustrating a schematic of a released structure 200. Depending on the embodiment, the released structure 200 is a deep etched structure itself having a high AR or is adjacent to a deep etched gap defining a space having a high AR between the released structure 200 and another structure. The released structure 200 is displaceable relative to a mechanically supportive substrate (not depicted).

In the exemplary embodiment illustrated, the released structure 200 includes a member 211 with a high AR, such as a beam or a blade, with a longitudinal length 250 that is significantly longer than at least one of the transverse lengths 240 and 230. In embodiments, the longitudinal length 250 is at least five times, and may be tens or even hundreds of times, longer than the shortest of the transverse lengths 240 and 230. The member 211 is otherwise a rigid object having any one of various shapes. For example, the member 211 may be a polyhedron as illustrated in FIG. 2A.

The transverse lengths 230 and 240 define the area of an end face 262 of a free end of the member 211. In the illustrated embodiment, the end face 262 undergoes maximum displacement relative to the substrate during operation of MEMS incorporating the released structure 200. The member 211 is coupled to a substrate (not depicted) via a flexure 254. The flexure 254 may be, for example, a torsional flexure which is the center of rotation for the released structure 100 within the X-Y plane (292, 291). In alternative embodiments, a flexure may further allow motion within the Z-direction (into/out of the page) 193, depending on the specific MEMS design.

In an embodiment, the member 211 comprises a recess 276 disposed in the end face 262. The recess 276 has a longitudinal axis 277 substantially parallel to a longitudinal axis 212 of the member 211. The recess 276 is dimensioned to have a transverse area smaller than the area of the end face 262 such that a sidewall 214 defining the longitudinal length of the member 211 is independent of the longitudinal recess length 251 (i.e., not reduced by the recess 276). It is beneficial to maintain the continuous sidewall surface area so capacitance of the member 211 is independent of the recess geometry and depth. The recess 276 thereby eliminates mass from the free end of the member 211 without reducing the sidewall surface area of the member 211 to advantageously move the center of mass from a first location (CM.sub.1), more distal from the center of rotation 254, to a second location (CM.sub.2), more proximate to the center of rotation 254. It is more beneficial to remove mass at the free end of the member 211 than elsewhere in the released structure 200 because mass at the free end is the greatest distance from center of rotation 254 and therefore has the greatest mechanical lever. Depending on dimensions of the end face 262 and fabrication capabilities, the recess 276 may have a longitudinal length 251 equal anywhere from 10% to 100% of the member's longitudinal length 250. To provide a significant mass reduction, the longitudinal length 251 is preferably at least 25% of the longitudinal length 250

Figure 2B:
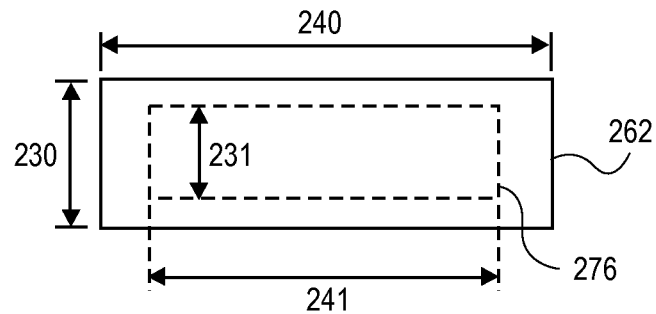
FIGS. 2B, 2C and 2D illustrate plan views of an end face of a member in accordance with embodiments of the present invention.
Figure 2C:
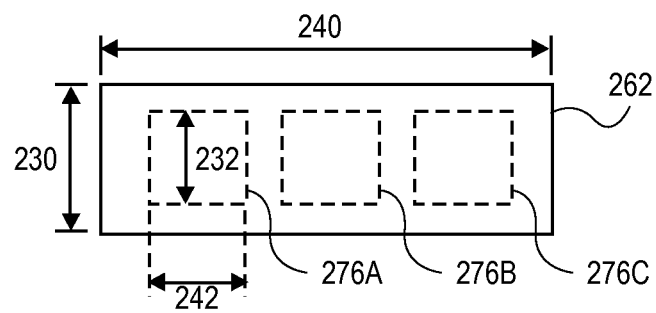
Figure 2D:
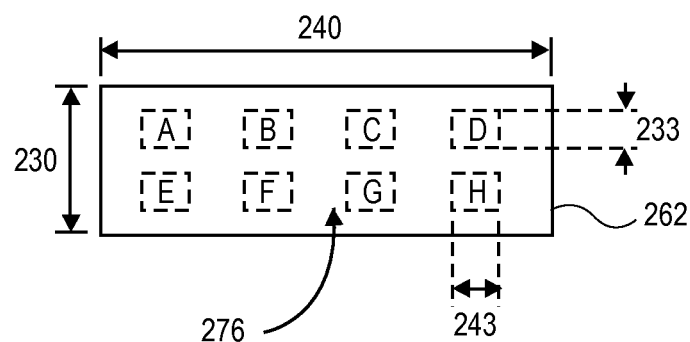
Figure 3:
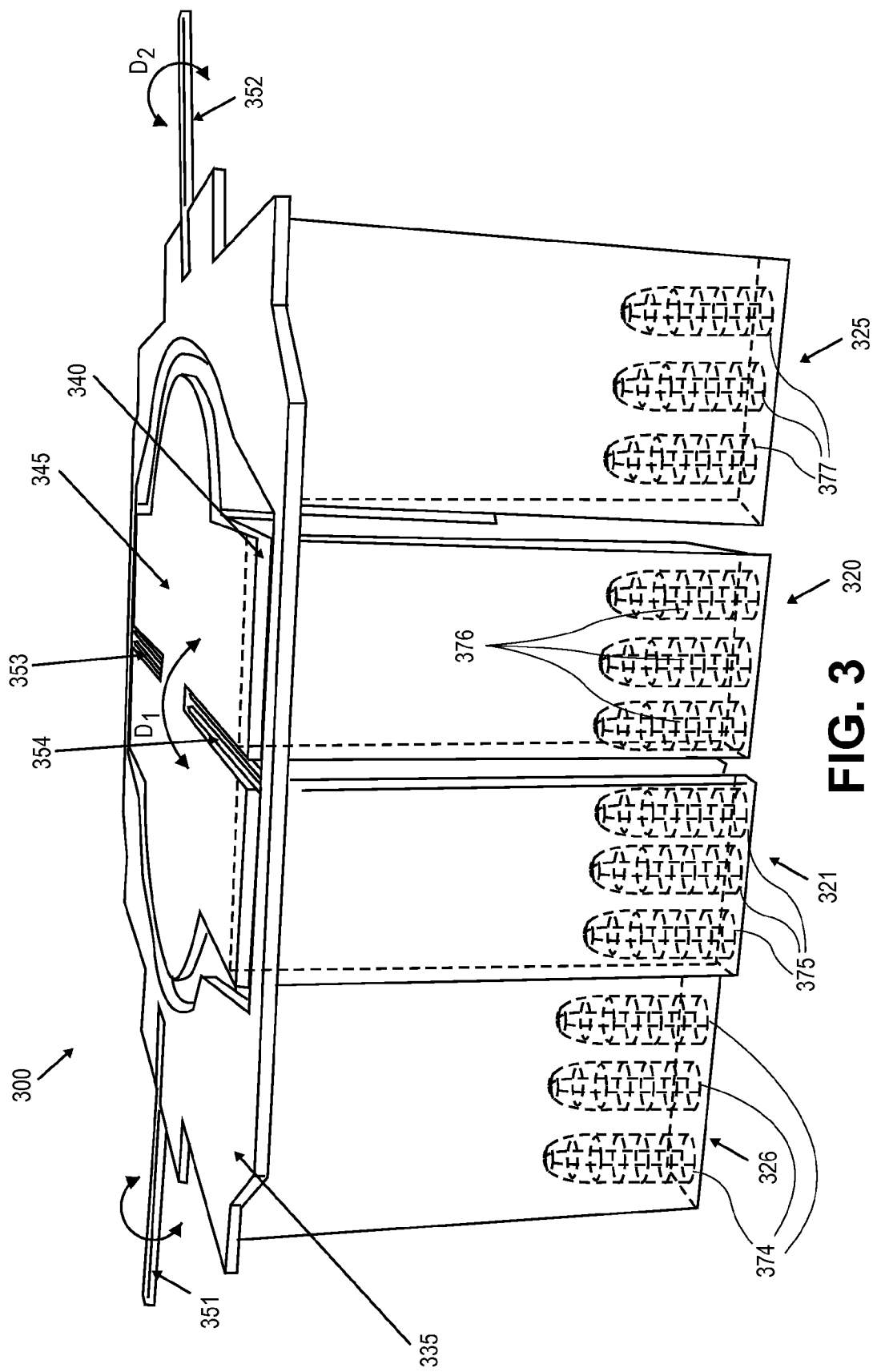
FIG. 3 illustrates a perspective view of a micromirror electrostatic actuator with members in accordance with an embodiment of the present invention.

FIGS. 2B, 2C and 2D further illustrate plan views of the end face 262 in accordance with embodiments of the present invention. As shown in FIG. 2B, a single recess 276 has transverse dimensions 231 and 241 less than the member's transverse dimensions 230 and 240. In further embodiments, a plurality of recesses 276 is formed in the end face 262 of the member 211. For example, in FIG. 2B, recesses 276A, 276B, and 276C are formed with transverse dimensions 232 and 242 sufficient to provide mechanical reinforcement to the member 211. The number of recesses 276 as well as their transverse dimensions 231, 241 may be optimized based on the particular AR of the member 211, the longitudinal depth 251, and the mechanical properties of the material from which the member 211 is formed. FIG. 2C, for example, illustrates a larger number of recesses, 276A-276H, with reduced transverse dimensions 233 and 243. The shape and arrangement of the recess(es) 276 within the area of the end face 262 may also be tailored following known mechanical design considerations (e.g., hexagonal packing of recesses, etc.) to permit maximum mass reduction while also imparting the member 211 with a desired mechanical strength sufficient to avoid unwanted actuation In a particular embodiment, the released structure 200 may be implemented as an electrostatic actuator for a micromirror. FIG. 3 illustrates a perspective view of an exemplary micromirror electrostatic actuator 300 with members 320, 321, 325 and 326, in accordance with an embodiment of the present invention. Actuator 300 includes a stage 340 and a frame 335. Either or both of the stage 340 and frame 335 may have a reflective top surface 345, such as a mirror. FIG. 2A shows the stage 340 parallel to the frame 335, but the stage 320 is pivotally coupled to the frame 335 using flexures 353 and 354 on diametrically opposed sides of stage 340 so that the stage 320 may pivot ($D.sub.1$) about a first axis. Flexures 353 and 354 suspend stage 340 in a cavity formed by frame 335 such that stage 340 is free to pivot around a rotational axis formed by flexures 353 and 354. Similarly, frame 335 is pivotally coupled to an outer mesa (not shown) using flexures 351 and 352 on diametrically opposed sides of frame 335. The outer mesa may be a stationary substrate, or alternatively, may also move relative to yet another reference substrate. Flexures 351 and 352 suspend frame 335 in a cavity formed by the outer frame such that frame 335 is free to pivot ($D.sub.2$) around a rotational axis formed by flexures 351 and 352. Flexures 351 and 352 are orthogonal to flexures 353 and 354, thereby enabling a reflective element coupled to stage 340 to be pivoted in two dimensions (e.g., rolled and pitched).

Stage 340 and frame 335 each have one or more members coupled to and extending from them. For example, members 320 and 321 are coupled to stage 340 and members 325 and 326 are coupled to frame 335. Members 320, 321 extend in a direction perpendicular to the undersurface of stage 340 and members 225,226 extend in a direction perpendicular to the undersurface of frame 335. An electric potential applied between members 320 and 325 may cause an attraction between the members. Because member 320 is coupled to stage 340, an attraction between members 320 and 325 causes stage 340 to pivot about the rotational axis formed by flexures 353 and 354. A similar principal may be applied to pivot the frame 335 about flexures 351, 352. A more complete description of the operation of the electrostatic actuator 300 may be found in U.S. Pat. No. 6,753,638.

In an embodiment, one or more of the high AR members coupled to an electrostatic actuator which are displaced during operation of the actuator have one or more recesses formed in an end face most distal from respective pivot points. Members which are not released and therefore not displaceable during operation need not have such recesses. The recesses formed in the members may be in any of the forms illustrated in FIGS. 2A-2D and described elsewhere herein. For example, as depicted in FIG. 3, recesses 374, 375, 376, and 377 are formed with longitudinal axis substantially parallel to longitudinal axis the members 320, 321, 325 and 326 with surface areas between the various members 320, 321, 325 and 326 independent of the longitudinal lengths of the recesses.

Figure 4:
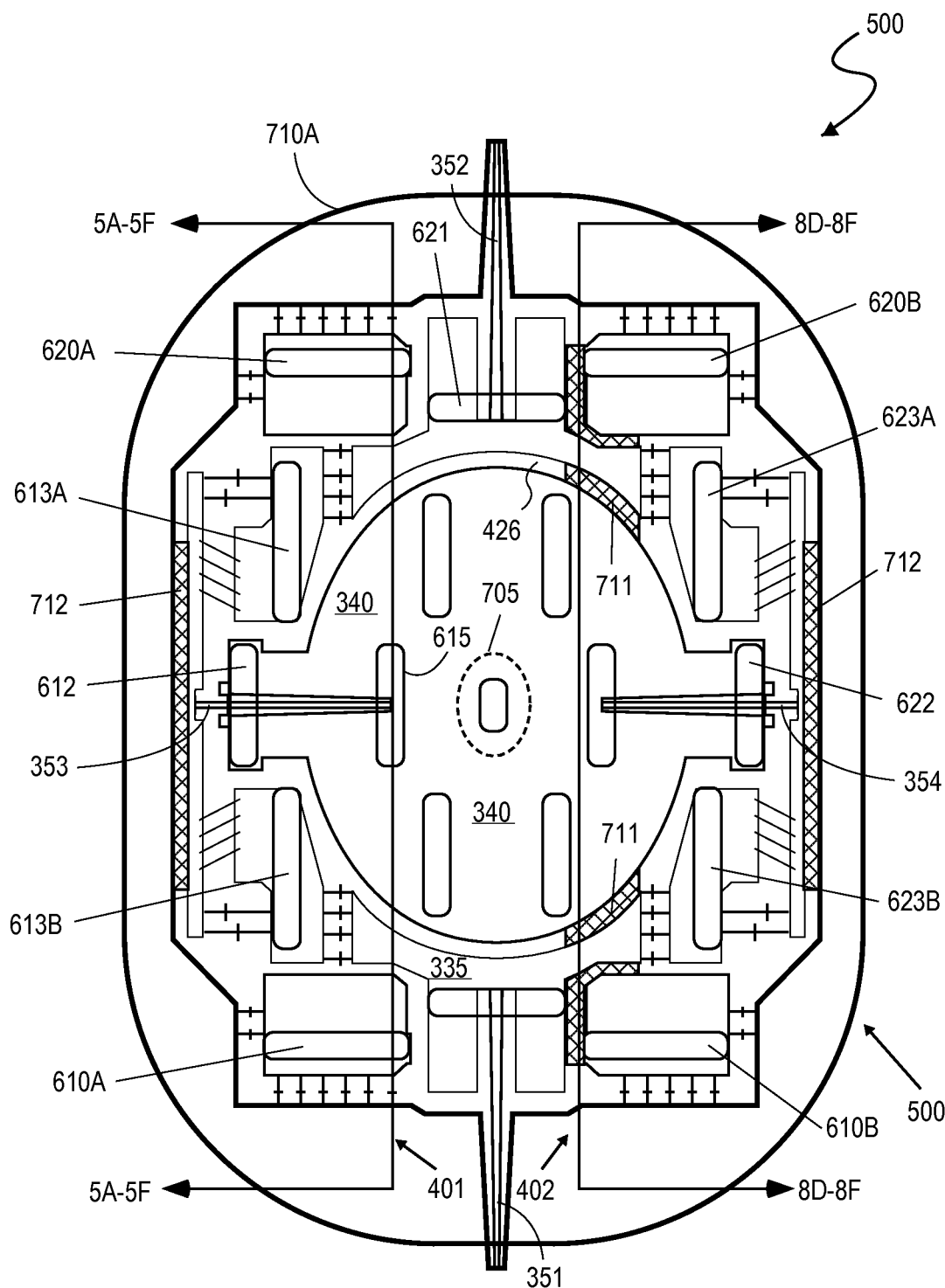
FIG. 4 illustrates a plan view of a micromirror electrostatic actuator in accordance with an embodiment of the present invention.

FIG. 4 illustrates a plan view of the undersurface of the micromirror electrostatic actuator 500, in accordance with an embodiment of the present invention. In the illustrated embodiment, members 612 and 622 are coupled to stage 340 and AR members 613a, 613b, 623A, and 623B are coupled to frame 335 on opposite ends of member 612. Members 621 and 611 are coupled on the opposite end of frame 35, with AR members 620a, 620b, and 610A, 610B coupled to frame 340 on opposite ends of members 621 and 611, respectively. Additional members 615 are coupled to the undersurface of stage 340 for mechanical stiffening and for reducing top surface distortions. Members 615 may further reduce etch depth variations across the device (e.g., as a result of etch loading, etc.).

In an embodiment, for a MEMS including a plurality of high aspect ratio members displaceable relative to a substrate, at least one member of plurality has a longitudinal length that is different than that of another member. Reducing the longitudinal length of certain members advantageously moves a released structure's center of mass in much the same manner as described for the recess 376. Selectively reducing the AR of only certain members therefore permits tuning of the mass center position while still offering the advantage of high electrostatic force via the longer AR members In one embodiment where a single released structure includes a plurality of high aspect ratio members at least one of the plurality has a reduced AR than another of the plurality. Such embodiments are useful where certain members, need not provide as much (or any) electrostatic function. For example, it is advantageous for stiffening members 615 to have an AR independent of other members which have electrostatic function. Such embodiments are also useful for situations where the released structure does not need to function isometrically (e.g., stroke length is a function of axis or direction along a particular axis) and therefore electrostatic properties may may vary between different dimensions of the released member. As a further illustration, in the micromirror electrostatic actuator 500 the frame 335 may need to pivot about the flexures 351,352 by smaller amount the stage 340 is pivot about the flexures 353, 354. As such, in FIG. 4 one or more of members 611, 621, 610A, 610B, 620A and 620B may be made shorter (i.e., with a lower AR) than are one or more of members 612, 613A, 613B, 622, 623A and 623B. As another example, where the frame 335 may need to pivot about one axis (e.g., the flexures 351,352) by a differing amounts in opposite directions, one or more of members 610A and 620A may be may be made shorter (i.e., with a lower AR) than are one or more of members 610B an 620B.

While the difference in longitudinal length between members may vary greatly depending on design, the difference is to be significantly greater than any differences passively induced by manufacturing non-unifomities. In one embodiment for example, the difference in longitudinal length between members is at least 10% of the longer member's longitudinal length, with the magnitude of difference depending on the different force/stroke distance required and the desired centroid position for the released structure (e.g., a low AR member may be provided to have a AR larger than dictated by force/stroke requirements alone to better position the centroid for vibration insensitivity). It should also be appreciated that either or both the highest AR members and members of reduced longitudinal length may further include a recess in an end face of the member, as previously described. Thus, various combinations of recessing and selective AR reductions can be utilized to position the released structure's centroid (center of mass).

A number of techniques may be used to fabricate the micromirror electrostatic actuator 500. Actuator 500 may be fabricated on a wafer-level using semiconductor fabrication techniques. Certain exemplary fabrication embodiments are discussed with reference to FIGS. 5A-5F providing cross-sectional views along cross-section line 401 shown in FIG. 4.

Figure 5A:
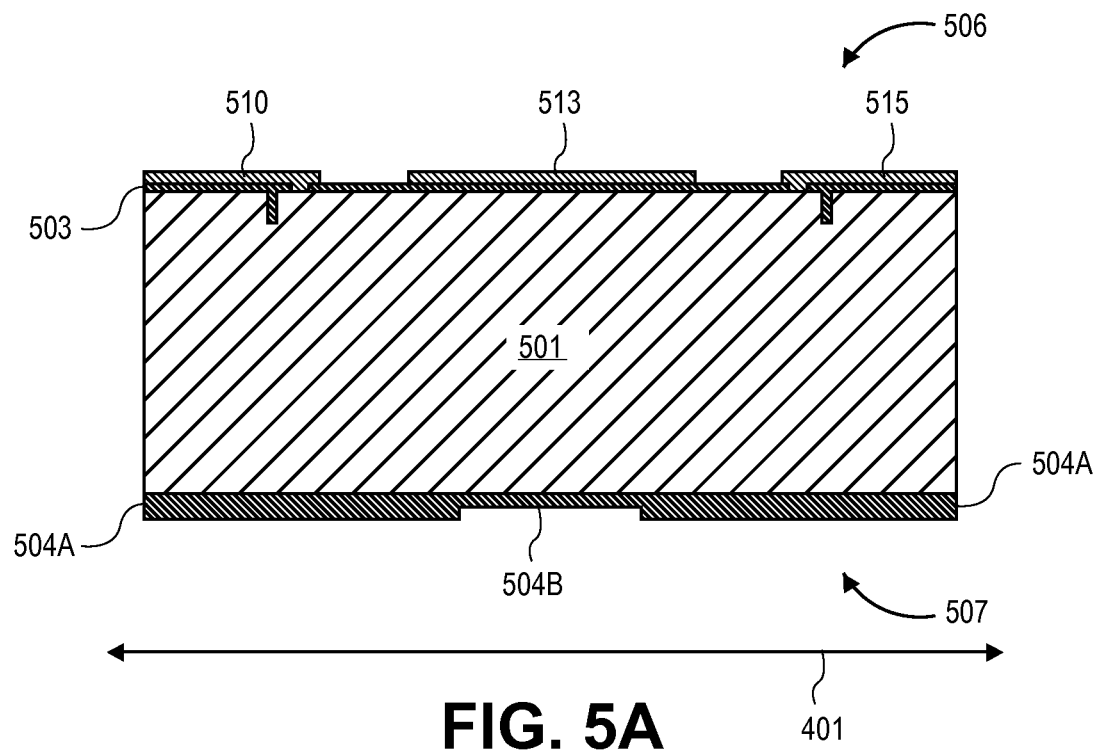
FIGS. 5A, 5B, 5C, 5D, 5E, and 5F illustrate cross-sectional views of a micromirror electrostatic actuator in stages of fabrication, in accordance with an embodiment of the present invention.

For certain embodiments, frame 335 and/or stage 340 may be formed from a substrate, for example, of silicon. FIG. 5A shows a silicon wafer 501 with a exemplary thickness in the range of 200-800 micrometers (.mu.m). The silicon wafer 501 has a topside (or device side or simply a top) 506 and a backside or bottom 507. On the top 506 is a dielectric layer 503 and isolation trenches 1120 of a material such as silicon dioxide, and formed with conventional trench isolation techniques. Interconnect metallization 910 makes contact to the silicon substrate 501 to provide actuator control. For one embodiment, the interconnect metallization 910 is aluminum and may be patterned using wet or dry etching or liftoff techniques known in the art. A reflective layer 513 may also be deposited to provide a reflective mirror surface tuned to provide high mirror reflectivity at the optical wavelengths of interest (e.g., for fiber optical communication). Exemplary materials for the reflective layer 513 include a single metal layer, such as aluminum, a stack of metal layers, such as Cr/Pt/Au, or Bragg-type structures of materials known in the art.

Standard front-to-back alignment is used to lithographically pattern a masking layer on the wafer backside 507. The member pattern is exposed and etched into a masking layer 504. The masking layer 504 may be a dielectric, for example comprised of a thermally grown silicon oxide, a chemical vapor deposited silicon dioxide, or combination thereof. A lithography pattern is transferred in the masking layer 504 by reactive ion etching, as illustrated in FIG. 5B.

For embodiments which are to include released structure members with end faces having one or more recesses, the masking layer 504 is to be patterned with one or more openings within a mask area of an end face 376A or 367B. For further embodiments which include released structure members of differing longitudinal lengths, the masking layer may be etched a first time with a first pattern to modify the masking layer 504 into regions with a first thickness 504A and regions with a second, reduced, thickness 504B. Then, as shown in FIG. 5B, the masking layer 504 is etch through with a second pattern to define a mask of an end face 376B for a longitudinally shorter member in the first region of the substrate 501 and a mask of an end face 376A for a longitudinally longer member in a second region of the substrate 501. It should also be noted the first and second patterning may be facilitated if the masking layer 504 is a stack of materials, such as silicon nitride and silicon dioxide, etc, which provides for etch selectivity enabling control of the reduced thickness 504B. For embodiments where all released structure members are to have the same length, the first patterning depicted in FIG. 5A may be skipped with only the second patterning illustrated in FIG. 5B needed to define mask patterns for the released structure members.

Figure 5B:
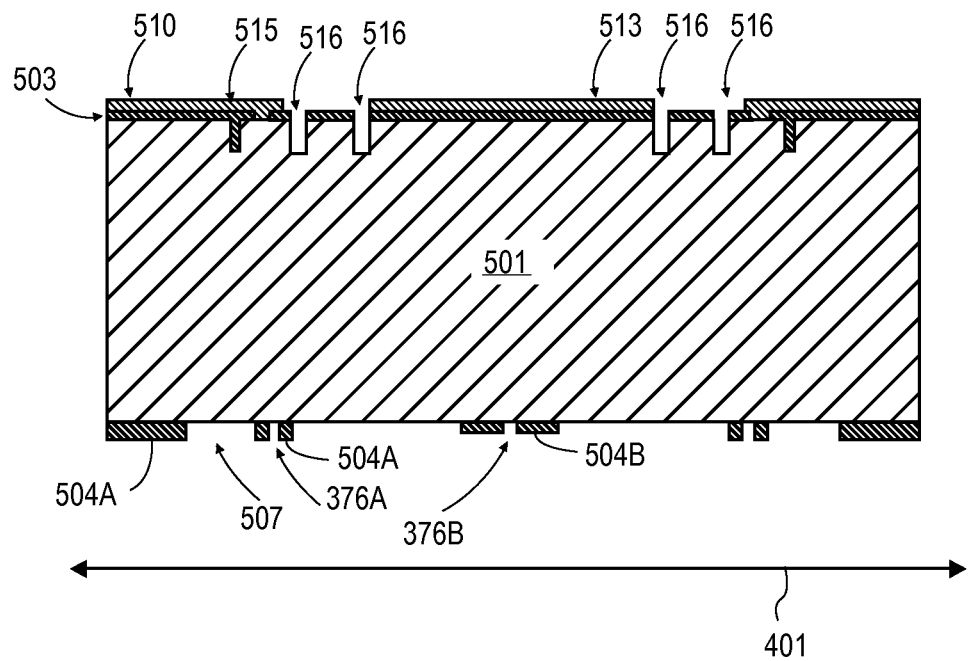

As further shown in FIG. 5B, prior to forming the released structure members, the processing of the substrate topside 506 is completed. A protection layer 515 may be applied on the metal surfaces 911 and 913 to protect the metallization 510, 513 during subsequent processing. Mirror structures including frame 335, stage 340, and flexures are defined using one or more etches that define trenches 516 separating the structural elements. The various etches may self-aligned and proceed through the interconnect metallization 510, dielectric 503, and into the substrate 501.

Figure 5C:
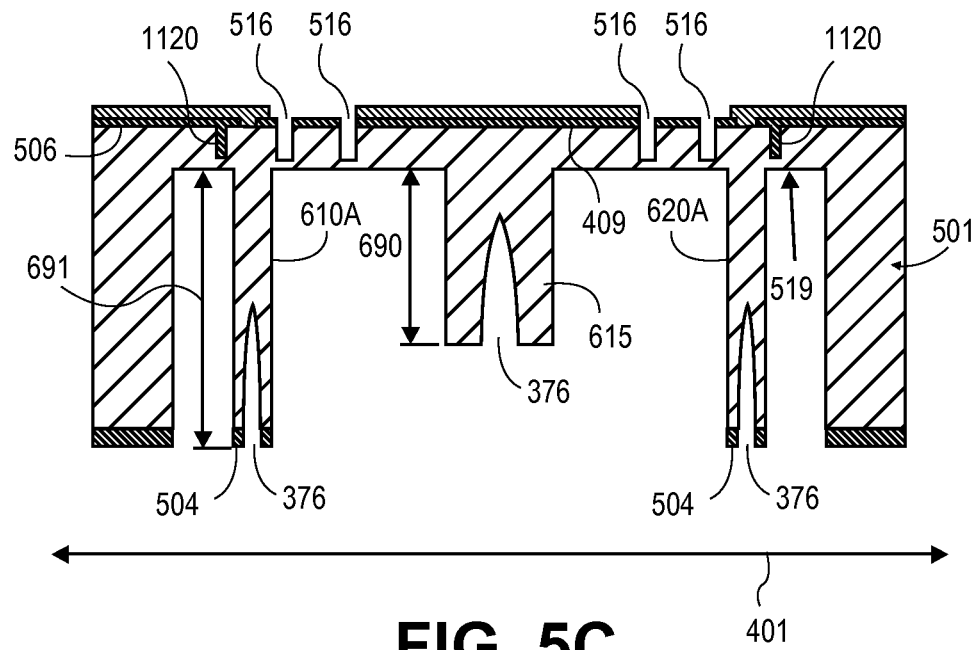

As shown in FIG. 5C, backside silicon etching transfers the blade pattern into the substrate 501 to obtain the members 610A, 620A and 615 (which fall on the cross-section line 401 in FIG. 4). The etching is performed using deep silicon etching at high selectivity to oxide, for example using the techniques reported in U.S. Pat. No. 5,501,893 which is now commonly used in the industry. The deep silicon etching achieves near vertical profiles in the members 610A, 620A and 615, which may have a transverse dimension (width) of nominally 5-20. mu.m and have a longest longitudinal length 691 in excess of 300.mu.m. The etch is timed so that the etch front 519 approaches or just reaches the bottom of the isolation joints 1120 or the structure trenches 516, yet does not punch through to the topside surface 506. An etch stop layer, such as a buried layer of a silicon-on-insulator (SOI) substrate may also be utilized to stop the etch at the appropriate thickness. Multiple members are etched simultaneously across the mirror element and across the mirror array. It should also be noted that depending on the aspect ratio of the recesses in the members 610A, 620A and 615, the etch front 519 may be tapered, as depicted, or flat.

As illustrated in FIG. 5C, for embodiments with recesses 376 formed in the members 610A, 615 and 620A, the deep anisotropic etch utilized to form the sidewalls of the members 610A, 615 and 620A concurrently forms the recesses 376. Generally, with the members having end face areas corresponding minimum transverse dimensions for the deep etch (e.g., 10.mu.m for a 300.mu.m longitudinal length), the recesses patterned in the masking layer 504 represent subminimum dimensions (e.g., 5.mu.m) for which an etch front will not proceed at the same rate as the etch front 519. Depending on the recess dimensions and the capabilities of the deep anisotropic etch utilized to form the members, etching of the recesses 376 is self-limited by aspect ratio (e.g., etch stop) to a depth that is less than the sidewall lengths, thereby limiting the longitudinal length (depth) of the recesses 376 to be somewhat less than the longest longitudinal length 691. The recesses 376 may further have tapered profiles along their longitudinal lengths. Through characterization of the deep anisotropic etch, the recesses 376 may dimensioned with the masking layer 504 to achieve a depth desired for moving the centroid a predetermined amount.

As further illustrated in FIG. 5C, for embodiments with members of differing length, the differing thicknesses 504A and 504B of the masking layer 504 are such that are reduced masking layer thickness 504B is entirely consumed by the etching (i.e., etch breakthrough) prior to termination of the timed etch so that the silicon substrate 501 where a shorter member 615 is to be formed is partially consumed and the longitudinal length 690 of the shorter member thereby reduced relative to longest longitudinal length 691 which had the benefit of the greater masking layer thickness 504A. In particular embodiments, the reduced masking layer thickness 504B is of a thickness (e.g., 0.5.mu.m) so that it is entirely consumed in sufficient time prior to termination of the backside etch for at least 10% of the longest longitudinal length 691 to be consumed (i.e., member 615 has a longitudinal length 690 that is 10% shorter than the longitudinal length 691 of member 610A).

Figure 6A:
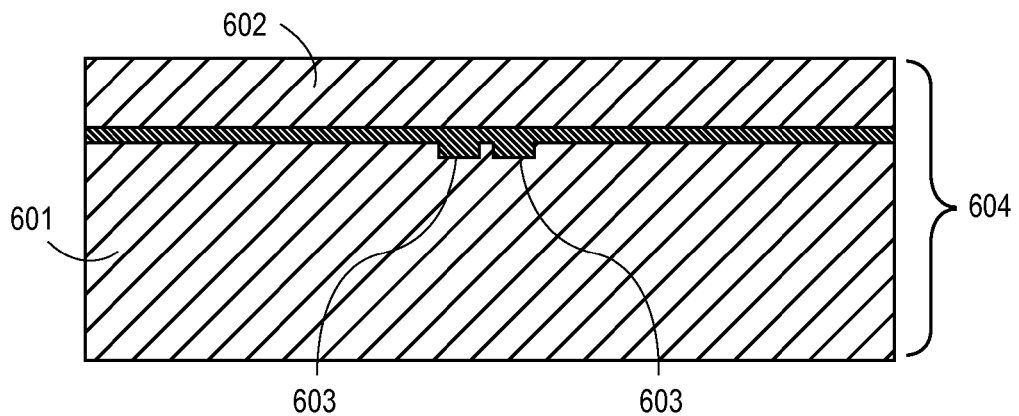
FIGS. 6A, 6B, 6C illustrate cross-sectional views of a micromirror electrostatic actuator in stages of fabrication, in accordance with an embodiment of the present invention.
Figure 6B:
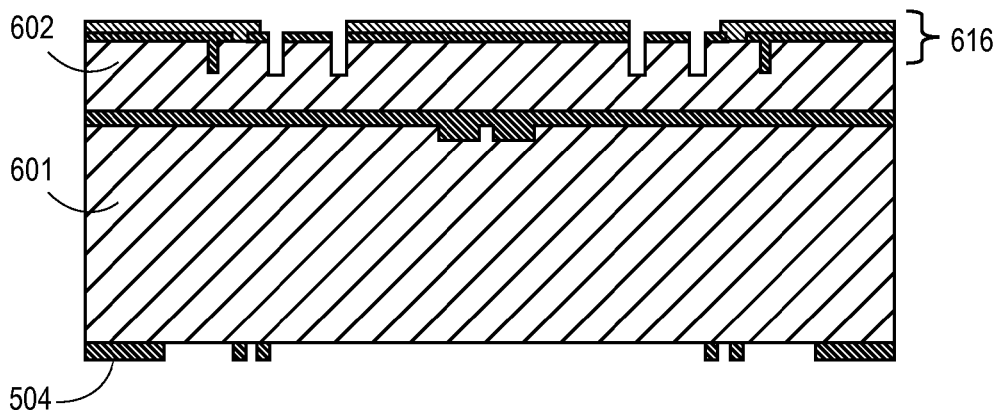
Figure 6C:
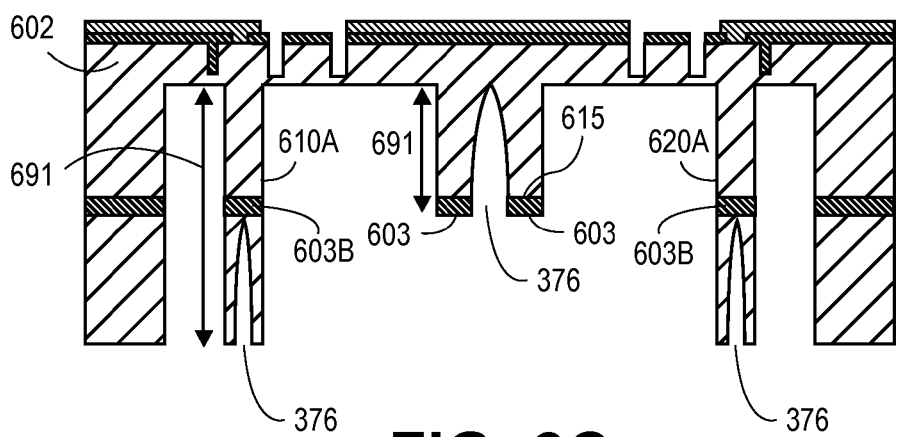

FIGS. 6A, 6B, 6C illustrate cross-sectional views of the micromirror electrostatic actuator 500, in accordance with an embodiment. The stages depicted in FIG. 6A-6C may be performed in alternative to the stages depicted in FIGS. 5A-5C to provide a plurality of members of differing length. In FIG. 6A, a first substrate 601 is bonded to a second substrate 602, for example with a known compression bonding technique. At least one of the substrates 601, 602 includes a patterned masking layer 603, which for example may be comprised of silicon dioxide or another material which offers selectivity to the material of substrates 601 and 602. As bonded, the substrates 601, 602 and patterned masking layer 603 form a member material stack with the masking layer 603 embedded below the thicknesses of substrate material.

The patterned masking layer 603 provides for a second material of greater thickness in a first substrate region than in a second substrate region. One or both sides of the bonded substrate 604 may be thinned (e.g., with buff grinding, chemical mechanical planarization, etc.) to dispose the patterned masking layer 603 at distances from the opposite surfaces of the bonded substrate that are appropriate to form members having the desired longest and shortest longitudinal lengths disposed the desired distance from topside features. For example, the thickness of the bonded substrate 604 may be thinned to be in the range described for the substrate 501. In a further embodiment, the substrate 601 is thinned to have a thickness approximately equal to the desired difference in longitudinal lengths of the members.

As shown in FIG. 6B, the bonded substrate 604 is then patterned substantially as described for FIG. 5A to form topside features 616, which include any of those described elsewhere herein for FIG. 5A. Similarly, a masking layer 504 is patterned to define masks for protecting end faces of the members to be formed. The masking layer 5045 may be formed and patterned substantially as previously described in the context of FIG. 5B with the exception that only a single patterning is performed.

As shown in FIG. 6C, deep anisotropic etching of the bonded substrate 604 is performed substantially as described for the substrate 501 illustrated in FIG. 5C. As shown, masking layer 504 defines the members 610A and 620A to have longitudinal lengths 691 while the material stack of member 615 is etched away until stopped by the embedded masking layer 603 prior to termination of the deep anisotropic etch. Upon the deep anisotropic etch exposing the embedded masking layer 603, the member 615 is formed as the deep etch continues and the etch front 519 passes through a reduced thickness of the embedded masking layer 603. As further shown in FIG. 6C, each of the masking layer 504 and the embedded masking layer 603 may be patterned to further provide for recesses 376 in any of the members, regardless of member aspect ratio.

Following the embodiment illustrated in FIGS. 6A-6C, the longer members 610A and 620A may incorporate features indicative of a bonded substrate interface at a longitudinal a distance from the end face approximately equal to the difference in longitudinal lengths between the longer members 610A and 620A and a shorter member 615. For example, as illustrated in FIG. 6C, the longer member includes a second material 603B where the bonding process depicted in FIG. 6A entails an unpatterned bonding layer, such as silicon dioxide, on one of the substrates 601 or 602 while the other of the substrates has the patterned masking layer 603. Through silicon via technology known in the art may then be used to make contact below 603B for application of a control voltage to a completed device.

Figure 5D:
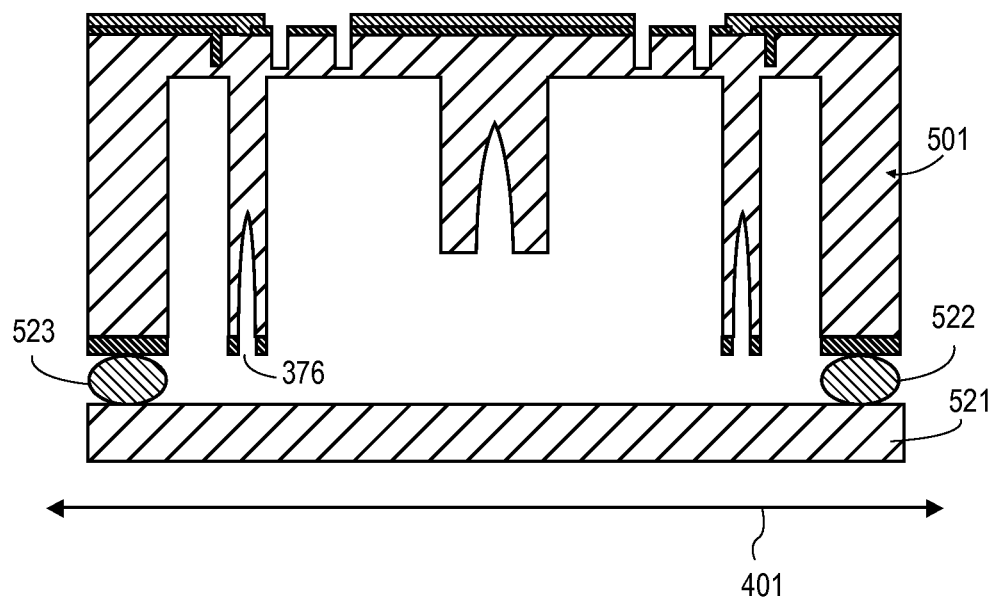

Fabrication of the micromirror electrostatic actuator 500 progresses to FIG. 5D following either FIG. 5C or FIG. 6C. As shown in FIG. 5D, a base wafer 521 is bonded to the substrate 501 to protect the members after their subsequent release. Any bonding technique known in the art may be employed. For one embodiment, the bonding is accomplished through the use of a frit glass material 522 that is heated to its flow temperature and then cooled. Alternative embodiments include eutectic solder systems.

Figure 5E:
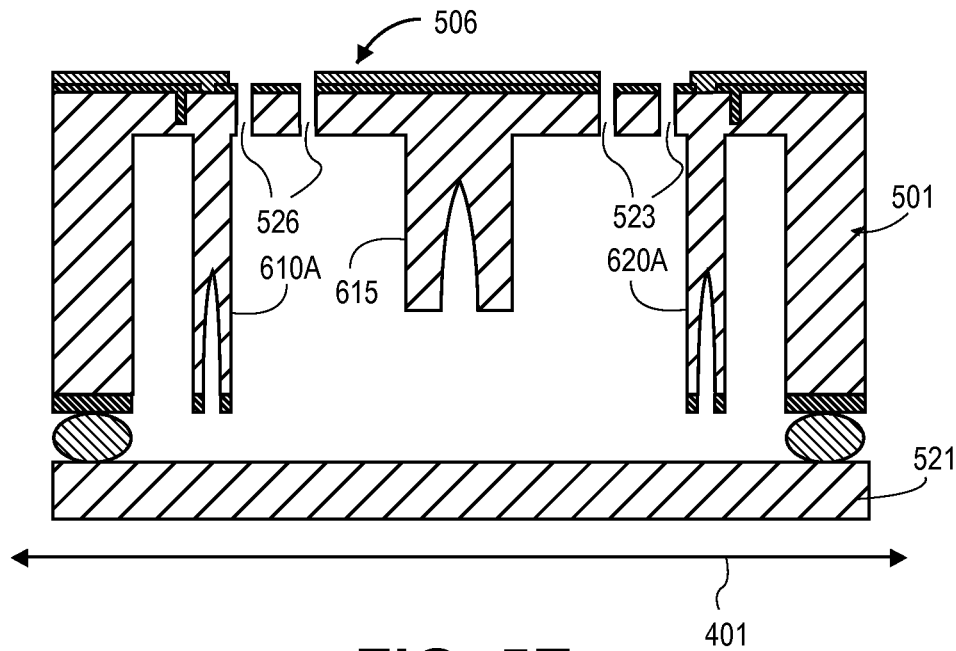

As shown in FIG. 5E, structure release is accomplished on the substrate topside 506, for example using a dry substrate etchant, such as SF.sub.6 plasma, to puncture through the trenches 516 from the substrate topside 506, forming through holes 526 and suspending the release element comprising the members 610A and 620 of the frame 335 and member 615 of the stage 340.

In an embodiment, a second substrate is affixed to a top side of a MEMS structure formed from a first substrate. Assembly of multiple substrates into a final released structure may advantageously provide a greater MEMS fill factor for array devices. For example, for an array of micromirror actuators 500 on a single base substrate, fill factor may be increased from 25-35% to 75-99% by attaching to the stage 340 a larger reflective surface fashioned from the second substrate. For many MEMS structures however, an addition of a second substrate destabilizes the released structure because the mass addition shifts the center of mass far from the plane containing the flexure (e.g., the MEMS structure becomes top heavy with the center of mass far above the flexure plane). However, as was illustrated in FIG. 1, for released structures comprising members with significant mass below a flexure plane, addition of a second substrate can render the center of mass balanced at the flexure. Hence in particularly advantageous embodiments, the addition of a second substrate to the first substrate is performed in conjunction with one or more of the member mass reduction techniques described elsewhere herein to realize, a balanced released structure simultaneously with a high fill factor.

Returning to the exemplary implementation of the micromirror electrostatic actuator 500 illustrated in FIG. 4, a mirror 710A is disposed over the stage 340 with an undersurface of the mirror 710A affixed to the top surface of the stage 340 at an attachment point 705. The attachment point 705 may utilize any material in the art known to be suitable for attaching one substrate to another substrate or to a package. For example, in an embodiment, the attachment point 705 utilizes an epoxy. In another embodiment, the attachment point 705 utilizes solder (e.g., microball technology or jetting) or compression. Either solder or epoxy enables wafer-level assembly technology for attachment of the mirror 710A to the stage 340, as described elsewhere herein.

Figure 5F:
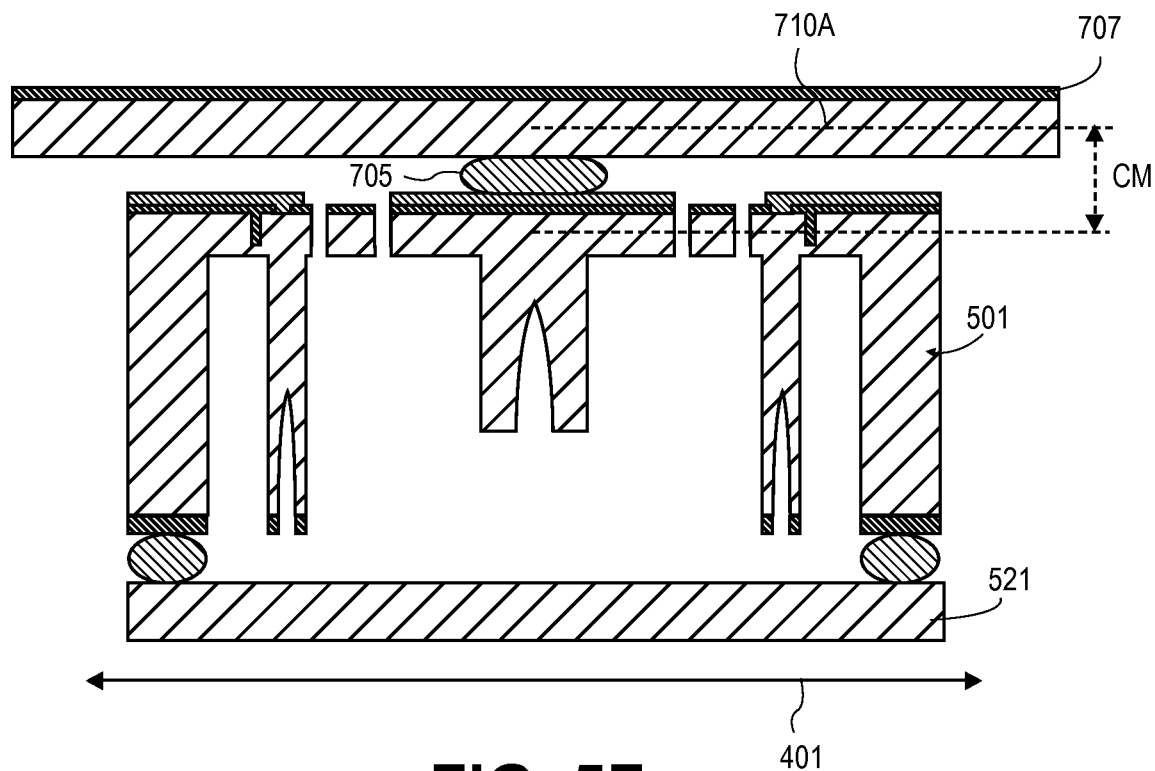

As further illustrated in cross-section in FIG. 5F, the mirror 710A includes a reflective layer 707 which may comprise any of the materials previously described for the reflective layer 513. It should also be noted that for embodiments which employ the mirror 710A, the reflective layer 513 may be either retained (e.g., as a matter of convenience as an established portion of device fabrication) or it may be replaced with alternate non-reflective materials since the reflective function of the reflective layer 513 is replaced by the mirror 710A.

As illustrated in both FIGS. 4 and 5F, the mirror 710A may have lateral dimensions such than the reflective layer 707 has a reflective area which is anywhere from 1.5 to 5 times, or more, greater than a top surface area of the stage 340 as limited by the mass, mechanical stiffness, and mechanical clearance of previously formed device sturctures etc. of the mirror 710A. In particularly advantageous embodiments, the reflective layer 707 has a reflective area which is between 2 and 3 times greater than a top surface area of the stage 340. Depending on the mass of the mirror 710A, and the mass of the high aspect ratio member(s) attached to the stage 340, the center of mass of the MEMS may be positioned anywhere between the undersurface of the mirror 710A and the undersurface of the stage 340, as depicted in FIG. 5F.

Figure 7:
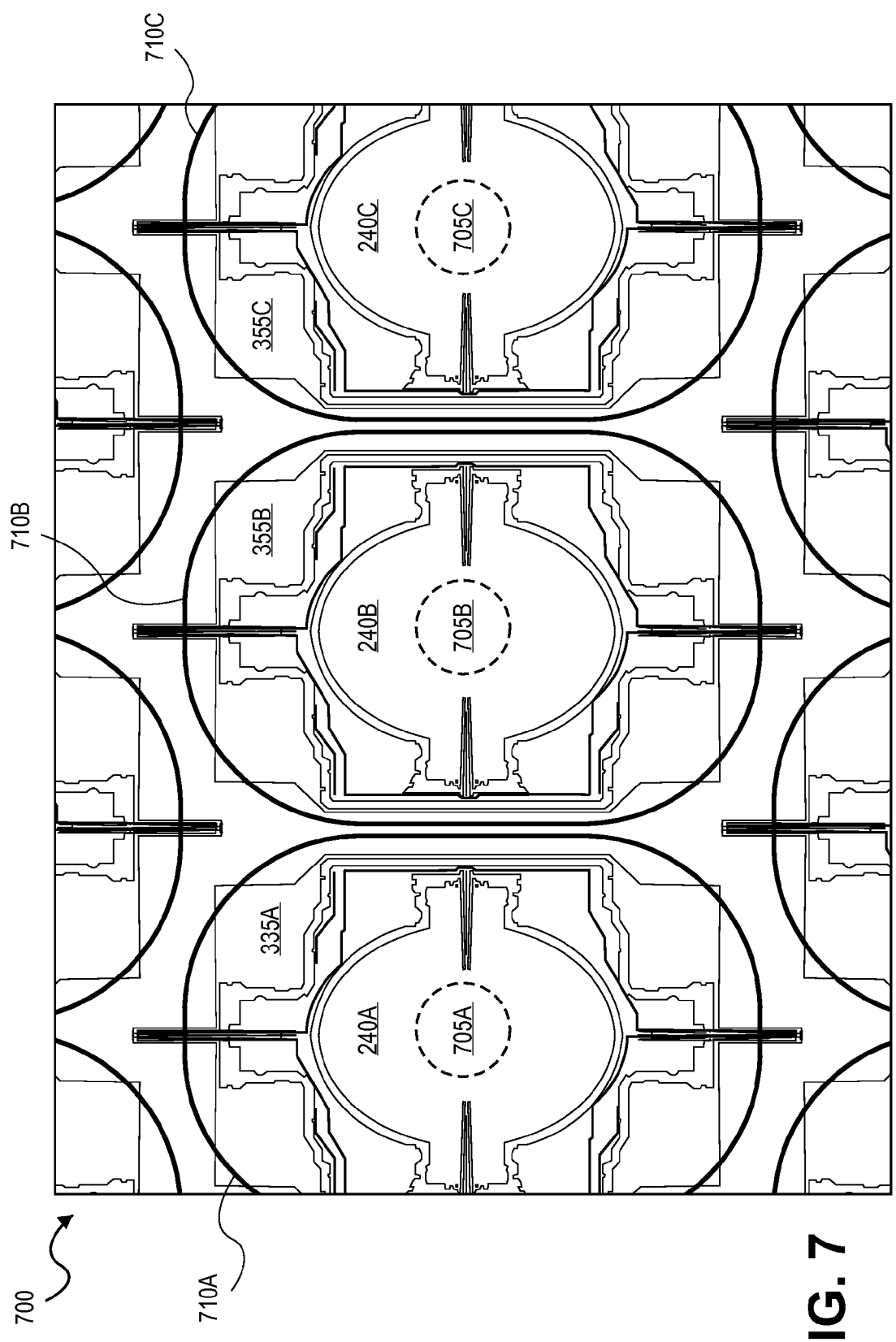
FIG. 7 illustrate a plan view of a plurality of micromirror electrostatic actuators in accordance with an embodiment of the present invention.

FIG. 7 illustrate a plan view of a plurality of micromirror electrostatic actuators 500 in accordance with an embodiment of the present invention. As illustrated, each of the arrayed electrostatic actuators 500 include a stage 340A, 340B, and 340C coupled to a mirrors 710A, 710B, and 710C at the attachment points 705A, 705B, 705C respectively. The arrayed actuators 500 may include any number of actuators 500 in an M.times.N grid, for example to form a non-blocking optical cross-point switch. In one such embodiment, the actuator array 700 includes 384 actuators sharing a single base substrate with each of the mirrors movable independent of each other as controlled by electrostatic forces generated by members coupled to undersurfaces of the stages 340. In one advantageous embodiment, each of the mirrors 710A, 710B and 710C are singulated from a single mirror substrate 710 which is affixed to the base substrate at the multiple attachment points (e.g., one or more attachment points 705 per actuator) using a wafer-level assembly process.

Attachment of a second substrate over a base substrate complicates MEMS structure release. A certain amount of attachment force is to be expected, for example in a ball grid array (BGA) type attachment process force is applied during solder reflow. The attachment force however may be detrimental to fragile released structures; therefore it would be advantageous to perform structure release after attachment of the second substrate. Post-attachment release however may be complicated by the presence of the second substrate. For example, many release techniques, like those described for FIG. 5E need unfettered access to the topside of the base substrate to form the minimally dimensioned through holes 526.

As such, in one embodiment, a two stage structure release is performed. In a first phase, structure release is performed as described for FIG. 5E and in a subsequent second phase, a through hole opening is formed through the second substrate to remove anchors bridging the free space gaps between the stage and the base substrate formed by the first release phase. For example, referring to FIG. 4, the mirror 710A includes through holes disposed over the anchors 711 and 712 bridging gaps 526 between the released structure (e.g., stage 340 and/or frame 335) and the reference substrate (that which the released structure is displaceable from). The anchors 711 and 712 are structural supports left behind by the first release phase which are dimensioned to provide sufficient support to the otherwise suspended structure during attachment of the mirror substrate. The through holes in the mirror substrate are then utilized for localized access to the structural supports following attachment of mirror substrate, thereby permitting the structural supports 711, 712 to be etched away leaving the completely released structure suspended from only the flexures.

Figure 8A:
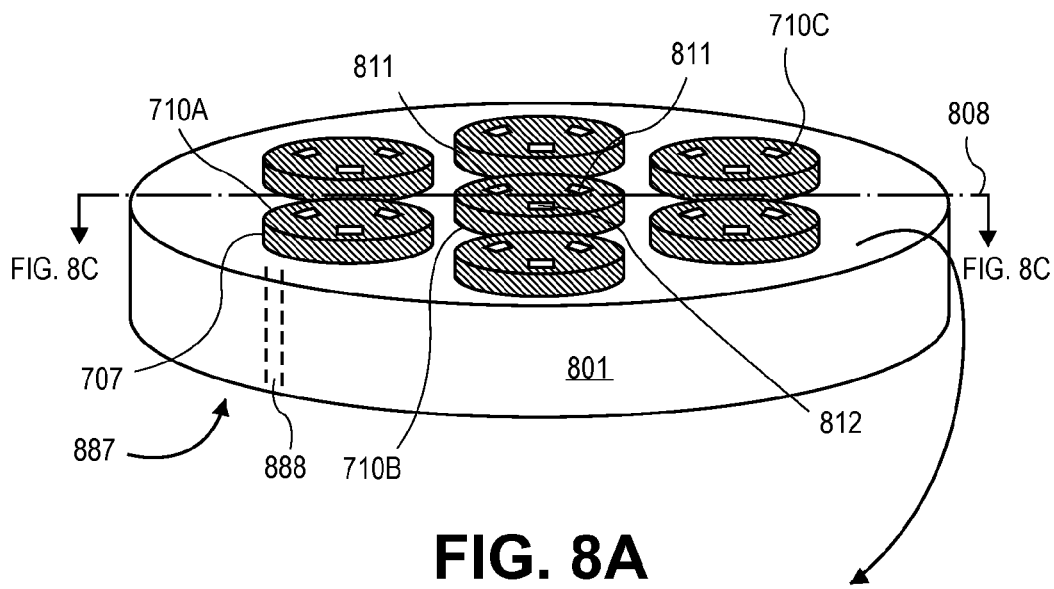
FIGS. 8A and 8B illustrate isometric views of a mirror substrate in stages of fabrication, in accordance with an embodiment of the present invention.
Figure 8B:
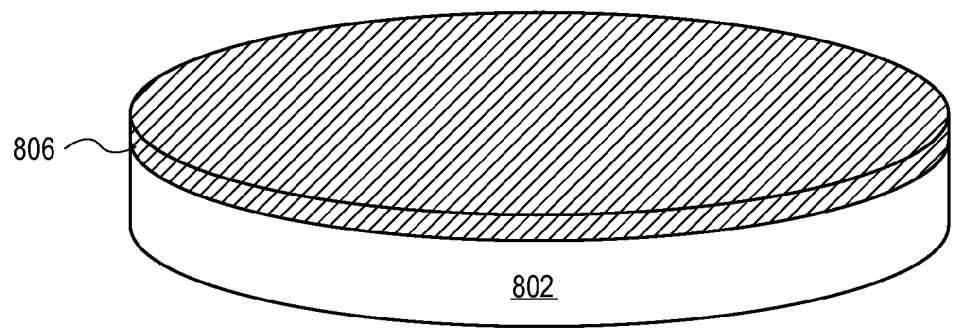

FIGS. 8A and 8B illustrate isometric views of a mirror substrate in stages of fabrication, in accordance with an embodiment of the present invention. Beginning with a first substrate 801, the reflective layer 707 is formed which is ultimately to become the optically reflective top surface of the mirror substrates 710A, 710B, and 710C. The first substrate may be any suitable material, and in one embodiment is silicon having a thickness of 200-300.mu.m, for example. A protection layer, such as silicon dioxide or the like, may further be disposed over reflective layer 707 and either or both the protection layer and reflective layer 707 is etched to define a pattern including openings 811 and 812 where through holes are to be subsequently formed through the mirror substrate. The reflective layer 707, or protection layer thereon, is to be of a bondable material.

In the exemplary embodiment illustrated in FIG. 8A, a backside 887 of the first substrate 801 is further patterned, for example with a deep silicon etch, to form a recess 888 aligned with an outer perimeter of the mirror substrates 710A, 710B and 710C. Such a recess may be timed or stopped on the reflective layer 707 or isolation layer disposed between the reflective layer 707 and the first substrate 801. As described further in herein in reference to FIG. 8C, the recess 888 is to further reduce the thickness of the first substrate 801 at a periphery of the mirror substrate 710 for greater mechanical clearance between the mirror substrate 710 and a base substrate.

As illustrated in FIG. 8B, the first substrate 801 is to be bonded (e.g., compression bonded) to a second substrate 802. The second substrate may be any suitable material, for example the same material and nominal thickness as the first substrate 801 (e.g., silicon). A bonding layer 806 may be disposed on a side of the first substrate 801. The bonding layer 806 may be unpatterned and is to be a bondable material, such as gold, for example.

Figure 8C:
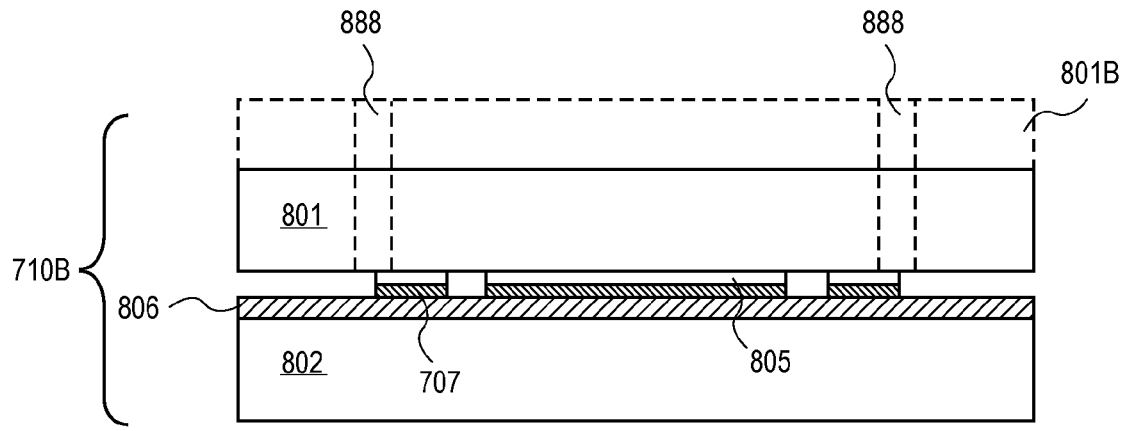
FIG. 8C illustrates a cross-sectional view of a wafer bonded mirror substrate assembled from a first and second substrate, in accordance with an embodiment.

FIG. 8C illustrates a cross-sectional view along the line 808 from FIG. 8A enlarged to illustrate only the exemplary mirror 710B (with other regions of the substrate similarly treated). The first and second substrates 801, 802 are bonded together so that the reflective layer 707 is disposed between thicknesses of the first and second substrates 801, 802 using any bonding technique known in the art, depending on the interface materials chosen. The bonded substrates 801, 802 are then thinned in preparation for one or the other of the first and second substrates 801, 802 to be attached to a base substrate. For example, as further illustrated in FIG. 8C, the first substrate 801 is thinned, removing the excess substrate thickness 801B, to form the undersurface of the mirror substrate 710B. The recess 888 previously formed in the backside 887 the first substrate then defines a reduced thickness at the periphery of the mirror For this exemplary embodiment, thinning of the first substrate 801 determines the approximate final thickness of the mirror substrate and therefore the ultimate mass of the mirror substrate. As an example, the first substrate 801 is thinned to less than 50.mu.m. Alternatively, the second substrate 802 may be thinned and attached to a base substrate.

Figure 8D:
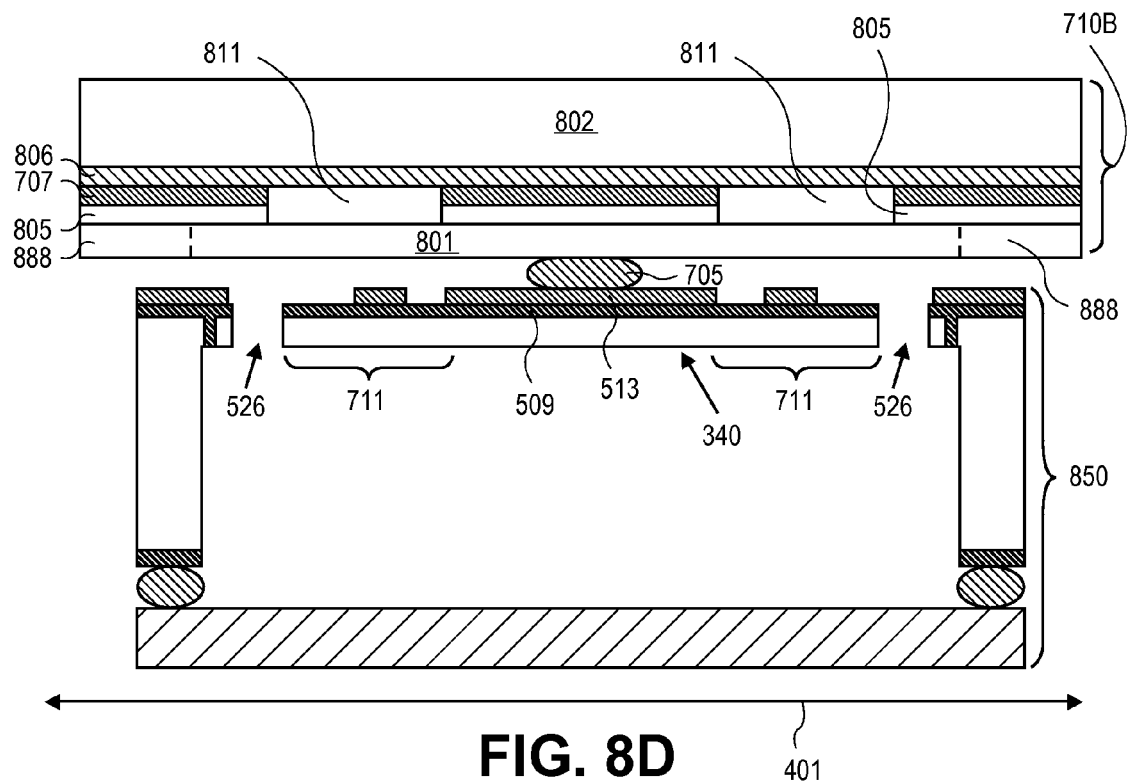
FIGS. 8D-8F illustrate cross-sectional views of a micromirror electrostatic actuator including a mirror substrate disposed on a base substrate in stages of fabrication, in accordance with an embodiment of the present invention.
Figure 8E:
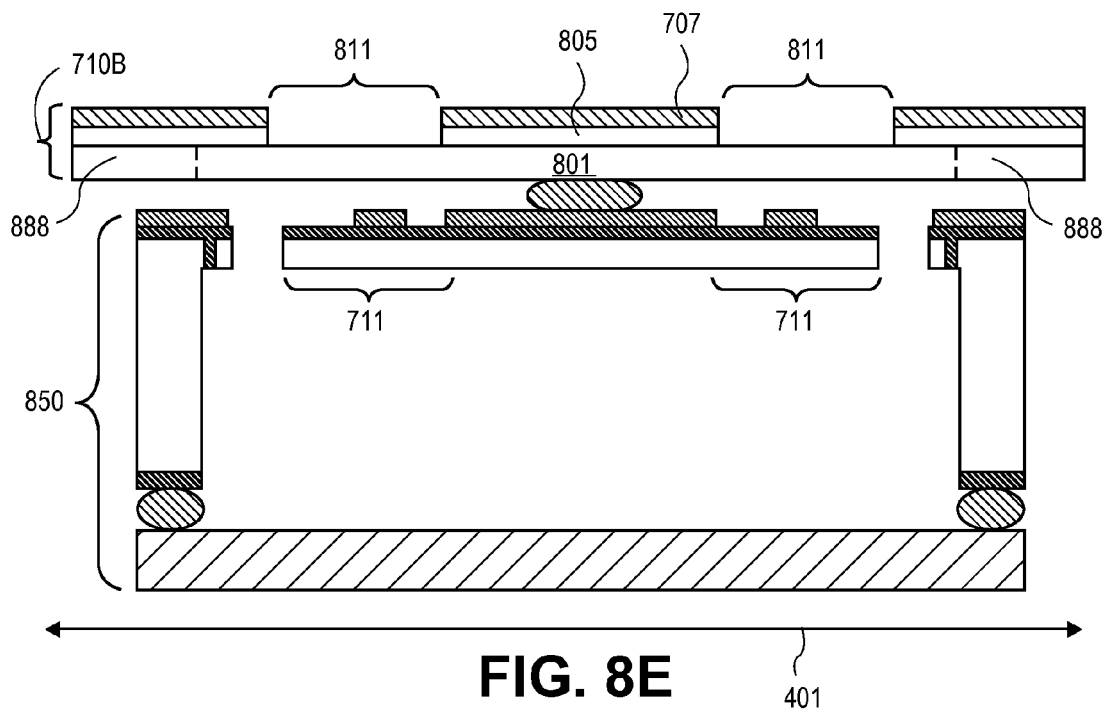
Figure 8F:
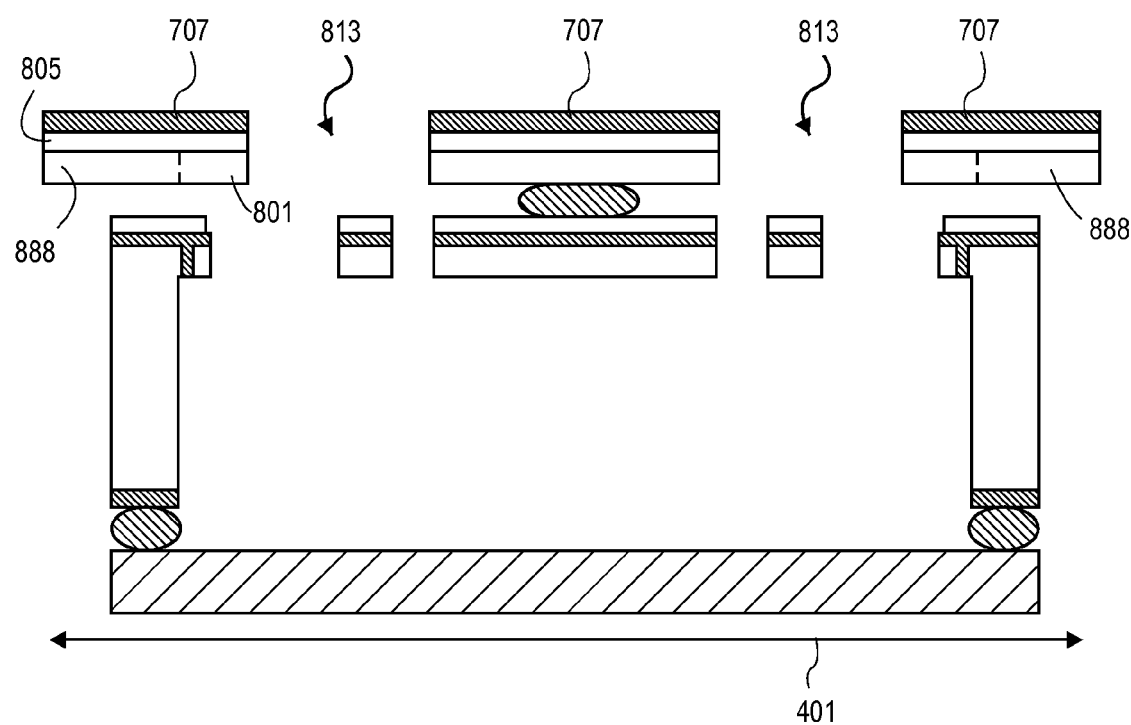

FIGS. 8D-8F illustrate cross-sectional views of a micromirror electrostatic actuator along the line 402 illustrated in FIG. 4 which corresponds to the line 808 in FIG. 8C. As shown in FIG. 8D, a surface of the mirror substrate 710B is affixed to a base substrate 850 with the attachment point 705 coupling the thinned substrate 801 to the top surface of the stage 340 (e.g., reflective layer 513). The recess 888, if present, reduces the thickness of the substrate 801 under at least a portion of the reflective layer 707. For one embodiment, attachment of the mirror substrate 710B is performed to every like actuator in parallel (e.g., at wafer-level). Alternatively, a die-level attachment may be performed. During a wafer-level attachment process, the mirror substrate 710B is aligned (along with the mirror substrates 710A and 710C) to the base substrate 850 so that the pattern openings 811 are aligned to be disposed over the anchor locations 711. At the time of attachment, the through holes 526 are present in the base substrate 850, having been formed in the first release phase while through holes are not yet present in mirror substrate 710.

As shown in FIG. 8E, the mirror substrate 710B is then further thinned to expose the openings 811 and expose either the embedded reflective layer 707 or the bonding layer 806. Continued etching of the mirror substrate further etches the pattern openings 811 through the thinned substrate 801 to expose the anchors 711. In one embodiment where the substrates 801, 802 are silicon, an anisotropic silicon etch such as the deep anisotropic silicon etch described for formation of the members or the like is utilized to both etch away the bulk of substrate 802 and form an anisotropic through hole into the thinned substrate 801.

As illustrated in FIG. 8F, anchors 711 are then etched way where exposed by the through holes 813 to complete the second structure release phase. In one exemplary embodiment where the anchors 711 are silicon, the same anisotropic silicon etch utilized to form the through holes 813 further removes the anchors 711. The etch of the anchors 811 may be timed to also remove the protection layer (if present) and thereby expose the reflective layer 707. Just as the pattern openings 811 are etched through to remove the anchors 711, the bulk of the mirror substrate 710B is similarly etched away to singulate the plurality of mirrors 710A, 710B, 710C and arrive at the assembled released structure including an array of actuators, each actuator attached to a mirror substrate, as illustrated in plan view in FIG. 7, and two different cross-sectional planes 401 and 402 in FIGS. 5F and 8F, respectively.

The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is to be determined entirely by the following claims, which are to be construed in accordance with established doctrines of claim interpretation.

What is claimed is:

1. A MEMS, comprising:
   a stage released from a base substrate, and a member with a longitudinal length extending perpendicular from an undersurface of the stage and having a free end displaceable relative to the base substrate; and
   a mirror substrate having an optically reflective top surface and an undersurface rigidly affixed to a top surface of the stage.

2. The MEMS of claim 1, wherein the top surface of the mirror substrate has a larger area than of the stage top surface.

3. The MEMS of claim 1, wherein the mirror substrate comprises a through hole via disposed over free space gaps between the stage and the base substrate, the free space gaps permitting the stage to be displaced relative to the base substrate with displacement of the member.

4. The MEMS of claim 1, wherein the center of mass of the MEMS is between the undersurface of the mirror substrate and the undersurface of the stage.

5. The MEMS of claim 1, wherein the mirror substrate is affixed to the stage by either epoxy or solder.

6. The MEMS of claim 1, further comprising a frame pivotally coupled to the stage, the frame comprising a second member, extending perpendicularly from an undersurface of the frame, the second member displaceable relative to both the base substrate and the first member.

7. The MEMS of claim 6, wherein the stage and the frame each have a plurality of members extending perpendicularly from the undersurfaces, wherein at least one member of the pluralities has a longitudinal length that is greater than another member of the pluralities.

8. The MEMS of claim 7, wherein the longer member comprises a first and a second material, the second material disposed a longitudinal distance from the free end of the longer member.

9. The MEMS of claim 1, wherein the member comprises a recess in an end face of the free end, the recess having a longitudinal axis substantially parallel to a longitudinal axis of the first member 10. The MEMS of claim 1, wherein the member has longitudinal length that is at least five time greater than a transverse length, and the wherein the mirror substrate has a top surface area at least two times greater than that of the stage.

11. A method of forming a MEMS, comprising:
   forming a stage from a base substrate, and a member with a longitudinal length extending perpendicular from an undersurface of the stage; and
   affixing to a top surface of the stage an undersurface of a mirror substrate having an optically reflective top surface.

12. The method of claim 11, further comprising:
   etching a through via into the mirror substrate to expose an anchor connected to the stage and disposed under the mirror substrate; and
   etching away the anchor exposed by the through via to release the stage after affixing the mirror substrate to the stage.

13. The method of claim 11, further comprising:
   thinning the mirror substrate after affixing the mirror substrate to the stage to expose a reflective layer embedded in the mirror substrate thickness.

14. The method of claim 13, wherein etching the through via also thins the mirror substrate to expose the reflective layer of a protection layer disposed over the reflective layer in a region of the mirror substrate where no through via is to be formed.

15. The method of claim 14, further comprising:
   forming the mirror substrate by compression bonding a first and second substrate together with the reflective layer disposed between thicknesses of the first and second substrates; and
   thinning the first or second substrate to form the undersurface of the mirror substrate.

16. The method of claim 15, wherein the reflective layer or protection layer is patterned to define through via positions where through vias are to be formed, and wherein the through via positions are aligned to be disposed over the anchor locations.

17. The method of claim 16, wherein the protection layer is silicon dioxide and the reflective layer comprises gold or aluminum.

18. The method of claim 12, further comprising:
   forming a through via in the base substrate before affixing the undersurface of the mirror substrate to the top surface of the stage.

19. The method of claim 18, wherein the member is coupled to the base substrate through a flexure and the anchor after forming the through via in the base substrate, and wherein the member is coupled to the base substrate only through the flexure after forming the through via in the mirror substrate.

20. The method of claim 19, wherein the base substrate and mirror substrate are silicon, the member is formed with a deep silicon etch from an underside of the base substrate, the through via is formed with a silicon etch from a topside of the base substrate, and wherein the through via is formed through the mirror substrate with a silicon etch from a topside of the mirror substrate.

21. A method of forming a plurality of MEMS, comprising:
   forming a plurality of stages from a base substrate, each stage having a member with a longitudinal length extending perpendicular from an undersurface of the stage;
   affixing to a top surface of each of the stages an undersurface of a mirror substrate having an optically reflective top surface;
   etching a through hole into the mirror substrate to expose an anchor connected to each of the plurality of stages; and
   etching away the anchors exposed by the through holes to release the stages after affixing the mirror substrate to each stage.

22. The method of claim 21, wherein etching the through hole further singulates the mirror substrate into a plurality of independent mirrors.

23. The method of claim 21, wherein etching the through hole further thins the mirror substrate to expose a protection layer embedded in a region of the mirror substrate where no through via is to be formed.

\* \* \* \* \*